United States Patent [19]

Ito

[11] Patent Number: 5,295,294
[45] Date of Patent: Mar. 22, 1994

[54] TRAY AND ELECTRONIC PARTS SUPPLYING APPARATUS

[75] Inventor: Hiroshi Ito, Shizuoka, Japan

[73] Assignee: Tenryu Technics Co., Ltd., Shizuoka, Japan

[21] Appl. No.: 909,734

[22] Filed: Jul. 7, 1992

[30] Foreign Application Priority Data

Jul. 10, 1991 [JP] Japan ............................. 3-169560

[51] Int. Cl.$^5$ ............................................. H05K 3/30
[52] U.S. Cl. .................................... 29/740; 29/759
[58] Field of Search ................ 29/739, 740, 741, 759, 29/743, 840

[56] References Cited

U.S. PATENT DOCUMENTS 4,868,973  9/1989  Fujishiro ........................... 29/740
4,999,909  3/1991  Eguchi et al. .................... 29/740

Primary Examiner—Carl E. Hall

[57] ABSTRACT

A tray and electronic supplying apparatus comprising a tray feeder for feeding a tray containing electronic parts; and an electronic parts feeder for transferring electronic parts in the tray, both the tray feeder and the electronic parts feeder being adjacent to a chip mounter and arranged in a board transferring line.

6 Claims, 4 Drawing Sheets

TRAY AND ELECTRONIC PARTS SUPPLYING APPARATUS

BACKGROUND OF THE INVENTION

1. Field of the Invention

The present invention relates to a tray and electronic parts supplying apparatus, and particularly to a tray and electronic parts supplying apparatus having a tray feeder which feeds a tray containing electronic parts therein, and an electronic parts feeder which transfers and feeds electronic parts contained in the tray.

2. Related Art Statement

This kind of tray and electronic parts supplying apparatus has been often used together with a chip mounter which mounts electronic parts such as semiconductor integrated circuit devices onto a circuit board etc.

In that case, the tray feeder for feeding trays is installed facing the front or the rear of the chip mounter, or being arranged on the side of and away from the board feeding line for the chip mounter.

In general, electronic parts in a tray fed by the tray feeder are transferred and fed from the tray to a mounting position of the mounter and then mounted onto a circuit board.

However, according to the prior art, both the tray feeder and the electronic parts feeder occupy the area for supplying electronic parts for the chip mounter, and hence, the space for installing other supplying devices is narrowed.

As a result, even if, for example, it is intended to install an increased number of tray feeders, there has been a disadvantage that the potential electronic parts supplying capability for the chip mounter is not fully effected because of space problem.

SUMMARY OF THE INVENTION

An object of the present invention is to provide a tray and electronic parts supplying apparatus wherein the space for supplying electronic parts is not occupied by both a tray feeder and an electronic parts feeder, and a space for installing another supplying devices is not decreased.

Another object of the present invention is to provide a tray and electronic parts supplying apparatus which does not deteriorate the potential capability of a chip mounter even if additional tray feeders are installed.

A typical invention herein disclosed will be explained in brief as follows:

A tray and electronic parts supplying apparatus according to the present invention is one used in combination with a chip mounter for mounting electronic parts onto a board. The tray and electronic parts supplying apparatus comprises a tray feeder for feeding a tray which contains electronic parts, and an electronic parts feeder for transferring and supplying the electronic parts contained in the tray. Also, both the tray feeder and the electronic parts feeder are arranged near to the chip mounter and in a board feeding line for the chip mounter.

According to the tray and electronic parts supplying apparatus of the present invention, since both the tray feeder and the electronic parts feeder are arranged near to the chip mounter and in the board feeding line, the space for supplying electronic parts to the chip mounter is not occupied by the tray feeder and the electronic parts feeder, whereby the space for installing other supplying devices is not decreased and installation of additional tray feeders does not decrease the potential electronic parts supplying capability of the chip mounter.

BRIEF DESCRIPTION OF THE DRAWINGS

The above and other objects and features of the present invention will become more apparent when referred to the following descriptions given in conjunction with the accompanying drawings wherein like reference numerals denote like elements, and in which.

DETAILED DESCRIPTION OF THE PREFERRED EMBODIMENT

Figure 1:
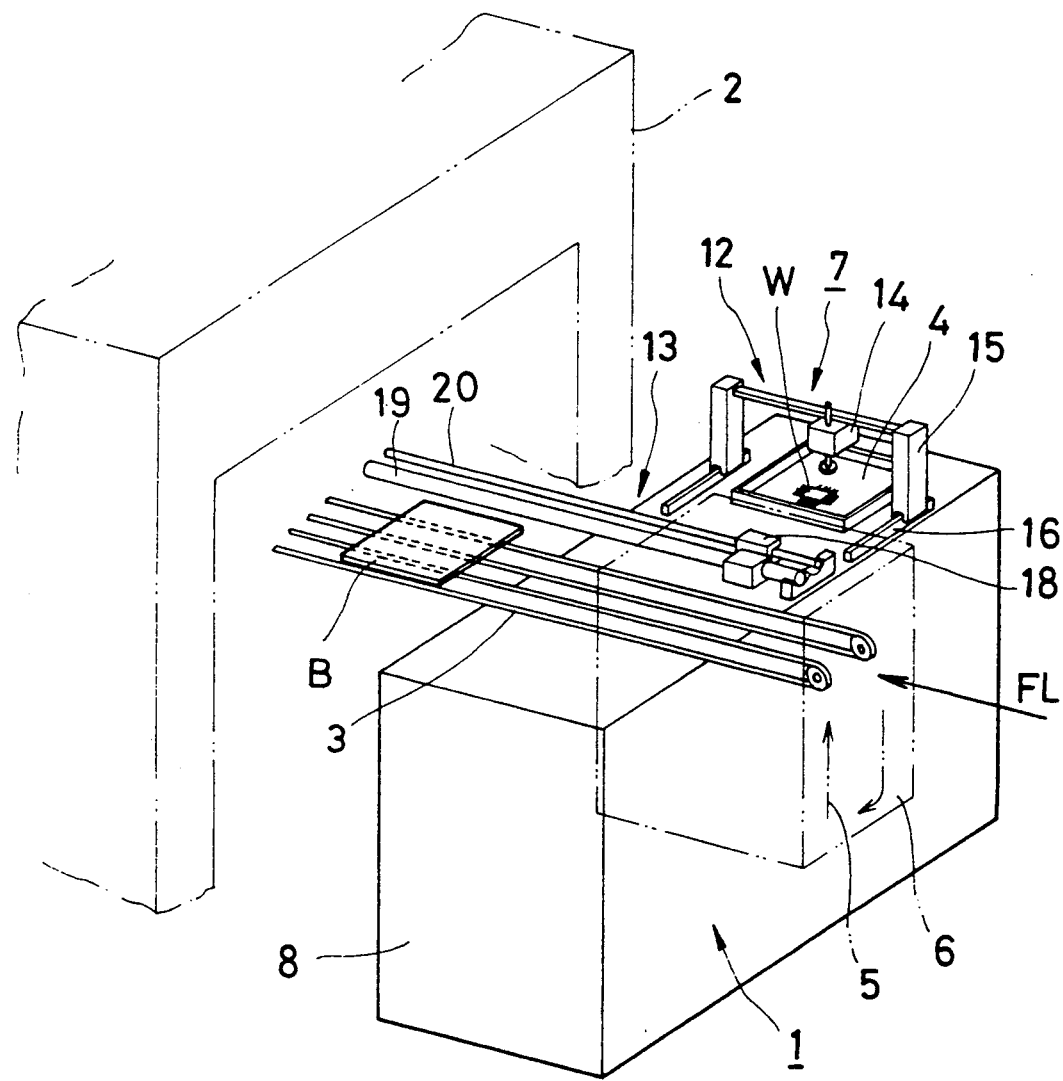
FIG. 1 is a schematic perspective view showing an embodiment of a tray and electronic parts supplying apparatus according to the present invention.

Referring to the drawings, as shown in FIG. 1, a tray and electronic parts supplying apparatus 1 of the present embodiment is installed contiguous to a chip mounter 2 for mounting electronic parts W onto a board B such as a circuit board, and is arranged in a board feeding line FL.

The board B is mounted on conveyer belts 3, and conveyed from the front right hand side in FIG. 1 into the chip mounter 2 along the board feeding line FL.

The supplying apparatus 1 comprises a tray feeder 6 for feeding the tray 4 containing electronic parts W along the feeding direction 5, and an electronic parts feeder 7 for supplying the electronic parts W on the tray 4 into the chip mounter 2.

The tray feeder 6 and the electronic parts feeder 7 are constructed as a unit surrounded by a frame 8 and a cover 9.

Figure 2:
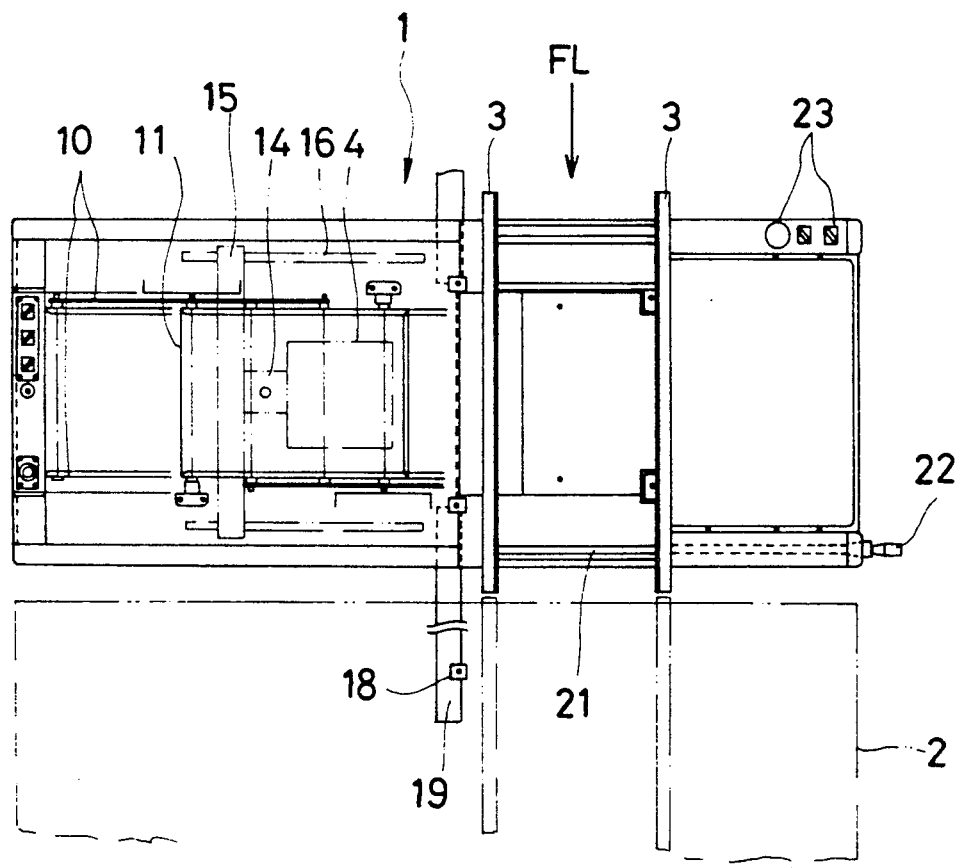
FIG. 2 is a plan view of the supplying apparatus shown in FIG. 1.

The tray feeder 6, as shown in FIG. 2, has a structure where a palette 11 is mounted on arms 10 which carries the pallete 11 in the vertical direction keeping it in a horizontal posture, so that the palette 11 is conveyed along an endless circulatory path of the vertical loop. When the pallet 11 reaches the top position of the endless circulatory path, the electronic parts W are picked up out of the tray 4 on that palette 11.

As shown in FIG. 1, the electronic parts feeder 7 comprises a first supplying portion 12 for picking up an electronic part W in the tray 4 and conveying it to the direction perpendicular to the board feeding line FL; and a second supplying portion 13 for carrying the electronic part W into a chip mounter 2 along the board feeding line FL.

Figure 4:
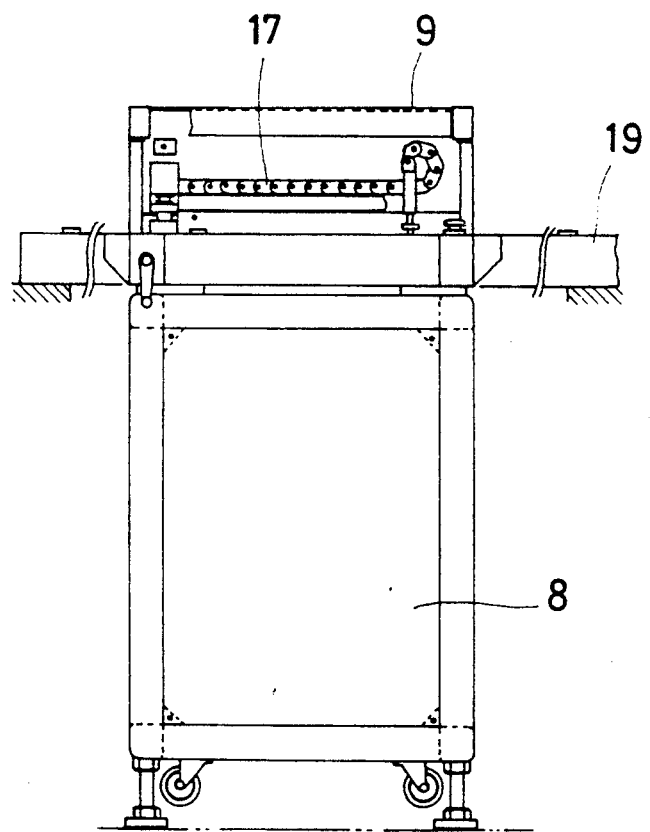
FIG. 4 is an end view of the supplying apparatus shown in FIG. 1.

The first supplying portion 12 has a suction head 14 for picking up an electronic part W in the tray 4 by utilizing vacuum suction; an n-shaped conveying mechanism 15 for supporting movably the suction head 14; and rails 16 on which the conveying mechanism 15 moves in the direction perpendicular to the board feeding line FL. The suction head 14 can be moved by means of a conveying means, for example, using a chain 17 as shown in FIG. 4.

As shown in FIG. 1, the second supplying portion 13 has a shuttle, i.e. a movable table 18 for mounting an electronic part W sucked by the suction head 14; a rodless cylinder 19 as a driving source for conveying the movable table 18; and a guide 20 for guiding travel of the movable table 18 driven by the cylinder 19.

Figure 3:
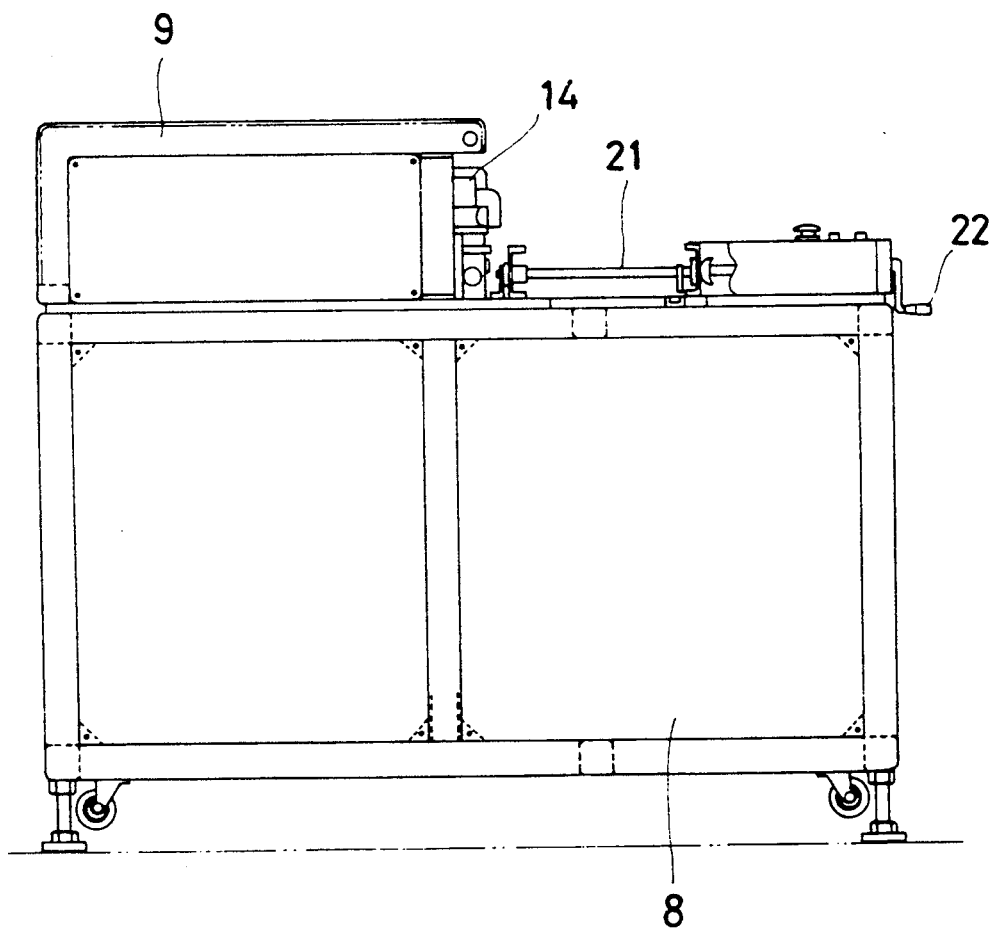
FIG. 3 is a side view of the supplying apparatus shown in FIG. 1.

In FIGS. 2 and 3, reference numeral 21 represents an adjusting shaft for adjusting the width of the conveyer belts 3; 22 represents a width adjusting handle; and 23 represents operational switches etc.

Next, operations of the present embodiment are described.

The tray feeder 6 feeds intermittently the tray 4, which is mounted on the pallet 11 and contains electronic parts W, along the endless circulatory path extending in the vertical direction.

When the tray 4 has reached the top position of the endless circulatory path, the first supplying portion 12 of the electronic parts feeder 7 operates so that the suction head 14 sucks an electronic part W in the tray 4. The electronic part W picked up through the vacuum suction is carried perpendicular to the board feeding line FL along the rails 16 for the conveying mechanism 15, and then mounted onto the movable table 18 of the second supplying portion 13.

Then, the electronic part W is supplied into the chip mounter 2, traveling together with the movable table 18 by means of the rodless cylinder 19, in the same direction as that of the board feeding line FL, i.e. in the direction parallel to the board feeding line FL.

On the other hand, the board B, on which the electronic parts W are to be mounted, is carried into the chip mounter 2 in the direction of the board feeding line FL, being mounted on the conveyer belt 3.

In the chip mounter 2, one or more electronic parts W are assembled onto the board B.

As described above, the invention has been explained based on the embodiment. However, the present invention should not be restricted to the embodiment. Needless to say, it is possible to make various modifications without departing from the scope of the invention.

For example, the structure of the tray feeder, the electronic parts feeder, the chip mounter and the like should not be restricted to the embodiment.

The above explanation has been made chiefly in the case where the invention is applied to an apparatus for supplying semiconductor integrated circuit devices. However, the field of utilization should not be restricted to that. For example, it is applicable to electronic parts other than semiconductor integrated circuit devices.

As for the invention herein disclosed, the typical advantages are as follows:

(1) In a tray and electronic parts supplying apparatus according to the present invention, both a tray feeder and an electronic parts feeder are adjacent to a chip mounter and arranged in a board feeding line, and hence, the area for supplying electronic parts for the chip mounter is not occupied by the tray feeder and the electronic parts feeder, thus not making the space for arranging other supplying devices reduce.

(2) As understood from the above feature (1), even if other tray feeders are installed additionally, the chip mounter can be supplied with electronic parts without degrading its inherent capability.

What is claimed is:

1. A tray and electronic parts supplying apparatus to be used in combination with a chip mounter for mounting electronic parts onto a board, comprising:

a tray feeder for feeding a tray containing electronic parts; and an electronic parts feeder for conveying and supplying said electronic parts in the tray; said tray feeder and said electronic parts feeder being adjacent to the chip mounter and arranged along a board feeding line;

said electronic parts feeding device comprising a first supplying portion for picking up an electronic part in said tray and for carrying it in the direction perpendicular to said board feeding line; and a second supplying portion for supplying said electronic part into said chip mounter in the same direction as said board feeding line, and said electronic parts feeder being arranged on the side of said board feeding line; and said tray feeder being positioned under the electronic parts feeder and within said tray and electronic parts supplying apparatus.

2. The tray and electronic parts supplying apparatus according to claim 1, wherein:

said tray feeder and said electronic parts feeder are built as one unit.

3. The tray and electronic parts supplying apparatus according to claim 1, wherein:

said board feeding line is comprised of a conveyer arranged toward an inside of said chip mounter and perpendicular to said chip mounter.

4. The tray and electronic parts supplying apparatus according to claim 1, wherein:

said first supplying portion comprises a suction head for picking up the electronic part in said tray through vacuum suction;

an n-shaped conveying mechanism for supporting movably the suction head; and rails on which said conveying mechanism moves perpendicularly to said board feeding line.

5. The tray and electronic parts supplying apparatus according to claim 4, wherein;

said second supplying portion comprises a movable table on which the electronic part sucked by said suction head is mounted; and a driving source for conveying the movable table.

6. The tray and electronic parts supplying apparatus according to claim 5, wherein:

said driving source for conveying the movable table comprises a cylinder for driving said movable table along said board feeding line; and said movable table travels being guided by a guide when drived by the cylinder.

* * * * *